(12) United States Patent
Jiang et al.

(10) Patent No.: US 11,877,517 B2
(45) Date of Patent: Jan. 16, 2024

(54) FLEXIBLE PIEZO-COMPOSITE SENSORS AND TRANSDUCERS

(71) Applicant: North Carolina State University, Raleigh, NC (US)

(72) Inventors: Xiaoning Jiang, Raleigh, NC (US); Taeyang Kim, Raleigh, NC (US); Yong Zhu, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 380 days.

(21) Appl. No.: 16/808,786

(22) Filed: Mar. 4, 2020

(65) Prior Publication Data

US 2020/0287123 A1   Sep. 10, 2020

Related U.S. Application Data

(60) Provisional application No. 62/813,896, filed on Mar. 5, 2019.

(51) Int. Cl.
| | | |
|---|---|---|
| *H01L 41/18* | (2006.01) | |
| *H10N 30/85* | (2023.01) | |
| *H10N 30/092* | (2023.01) | |
| *H10N 30/30* | (2023.01) | |
| *H10N 30/87* | (2023.01) | |
| *H10N 30/853* | (2023.01) | |

(52) U.S. Cl.
CPC ......... *H10N 30/852* (2023.02); *H10N 30/092* (2023.02); *H10N 30/302* (2023.02); *H10N 30/8554* (2023.02); *H10N 30/877* (2023.02)

(58) Field of Classification Search
CPC ............... H01L 41/183; H01L 41/0477; H01L 41/1132; H01L 41/1876; H01L 41/37; H01L 41/09; B06B 1/0688; B06B 1/0622
See application file for complete search history.

(56) References Cited

U.S. PATENT DOCUMENTS 6,776,762 B2   8/2004   Erikson et al.
10,718,676 B2 *  7/2020   Chen .................... H01L 45/1233
(Continued)

OTHER PUBLICATIONS

Kim, T. A. E. Y. A. N. G. (Jun. 24, 2018). Abstract—repository.lib.ncsu.edu. Kim, Taeyang. Retrieved Apr. 11, 2023, from https://repository.lib.ncsu.edu/bitstream/handle/1840.20/35309/etd.pdf?sequence=1 (Year: 2018).*
(Continued)

*Primary Examiner* — Jarrett J Stark
(74) *Attorney, Agent, or Firm* — Thomas | Horstemeyer, LLP

(57) ABSTRACT

Disclosed are various embodiments for a piezo-composite transducer that is flexible such that it may conform to regular or irregular shapes. A flexible piezo-composite transducer may include an active piezoelectric material, such as PZT-5H, and a passive polymer matrix formed of a flexible material, such as polydimethylsiloxane (PDMS). The flexible piezo-composite transducer may include a first side and a second side, where each of the first side and the second side include a first electrode and a second electrode deposited thereon, respectively. At least one of the first electrode and the second electrode may include a silver nanowire (AgNW) and PDMS electrode that is flexible.

12 Claims, 17 Drawing Sheets

Optical Images (Side View)

(56) References Cited

U.S. PATENT DOCUMENTS

| | | | |
|---|---|---|---|
| 2006/0079785 A1* | 4/2006 | Hosono | G10K 11/02 |
| | | | 600/459 |
| 2013/0060140 A1 | 3/2013 | Sinelnikov | |
| 2013/0187201 A1* | 7/2013 | Elian | H01L 29/84 |
| | | | 257/E29.166 |
| 2014/0180128 A1* | 6/2014 | Corl | B06B 1/0622 |
| | | | 600/467 |
| 2016/0211777 A1* | 7/2016 | Kim | H01L 41/113 |
| 2016/0338639 A1* | 11/2016 | Myers | A61B 5/681 |
| 2017/0172439 A1* | 6/2017 | Zhu | B32B 15/043 |
| 2017/0370024 A1* | 12/2017 | Zhou | D01D 10/02 |
| 2018/0103852 A1* | 4/2018 | Dagdeviren | A61B 5/444 |
| 2018/0154394 A1* | 6/2018 | Haque | B06B 1/0629 |
| 2019/0026519 A1* | 1/2019 | Park | G06V 40/1306 |
| 2020/0287123 A1* | 9/2020 | Jiang | H01L 41/37 |
| 2020/0405258 A1* | 12/2020 | Dayton | A61B 17/22004 |
| 2021/0003534 A1* | 1/2021 | Lal | G01N 29/2437 |
| 2021/0267614 A1* | 9/2021 | Jiang | B06B 1/0629 |
| 2022/0102604 A1* | 3/2022 | Do | H01L 24/82 |

OTHER PUBLICATIONS

Taeyang Kim, Zheng Cui, Yong Zhu, and Xiaoning Jiang "Flexible piezo-composite ultrasound transducers for biomedical applications (Conference Presentation)", Proc. SPIE 10600, Health Monitoring of Structural and Biological Systems XII, 106000Y (Apr. 3, 2018); https://doi.org/10.1117/12.2295939 (Year: 2018).*

Gavrilov, L. R., ; et al (1996) "Application of Focused Ultrasound for the Stimulation of Neural Structures." Ultrasound in medicine & biology 22.2 : pp. 179-192.

Nemati, Ebrahim, ; et al. (2012) "A Wireless Wearable ECG Sensor for Long-Term Applications." IEEE Communications Magazine 50.1 : pp. 36-43.

Kim, Jinwook, et al. (2015) "Phantom Evaluation of Stacked-Type Dual-Frequency 1-3 Composite Transducers: A Feasibility Study on Intracavitary Acoustic Angiography." Ultrasonics 63 : 7-15.

Lindsey, Brooks D., et al. (2017) "Dual-Frequency Piezoelectric Endoscopic Transducer for Imaging Vascular Invasion in Pancreatic Cancer." IEEE transactions on ultrasonics, ferroelectrics, and frequency control 64.7: 1078-1086.

Di, Jin, et al. (2015) "Spatiotemporal Drug Delivery Using Laser-Generated-Focused Ultrasound System." Journal of Controlled Release 220 : 592-599.

Basaeri, Hamid,; et al (2016) "A Review of Acoustic Power Transfer for Bio-Medical Implants." Smart Materials and Structures 25.12 : 123001.

Zhou, X. S., et al. (2014) "Sputtered ZnO Film on Aluminium Foils for Flexible Ultrasonic Transducers." Ultrasonics 54.7 : pp. 1991-1998.

Hou, Ruozhou, et al. (2012) "AIN Thin Film Transducers for High Temperature Non-Destructive Testing Applications." Journal of Applied Physics 111.7 : pp. 074510.

Yoon, Sunghyun,; et al (2016) "A Flexible and Wearable Human Stress Monitoring Patch." Scientific reports 6 : pp. 23468.

Chandrana, Chaitanya, et al. (2010) "Design and Analysis of MEMS Based PVDF Ultrasonic Transducers for Vascular Imaging." Sensors 10.9 : pp. 8740-8750.

Qi, Yi, et al. (2010) "Piezoelectric Ribbons Printed onto Rubber for Flexible Energy Conversion." Nano letters 10.2 : pp. 524-528.

Lowe, Premesh S., et al. (2017) "Flexible Shear Mode Transducer for Structural Health Monitoring Using Ultrasonic Guided Waves." IEEE Transactions on Industrial Informatics 14.7 : pp. 2984-2993.

Zhuang, Xuefeng, et al. (2008) "Fabrication of Flexible Transducer Arrays with Through-Wafer Electrical Interconnects Based on Trench Refilling with PDMS." Journal of Microelectromechanical Systems 17.2 : pp. 446-452.

Kulkarni, Vishal. (2011) "Flexible Two-dimensional Ultrasonic Transducer Array: Design, Fabrication and Characterization."

Hu, Hongjie, et al. (2018) "Stretchable Ultrasonic Transducer Arrays for Three-Dimensional Imaging on Complex Surfaces." Science advances 4.3 : pp. 1-12.

Seip, Ralf, et al. (2005) "Annular and Cylindrical Phased Array Geometries for Transrectal High-Intensity Focused Ultrasound (HIFU) using PZT and Piezocomposite Materials." AIP Conference Proceedings. vol. 754. No. 1. American Institute of Physics, pp. 229-232.

Jeong, Chang Kyu, et al. (2015) "A Hyper-Stretchable Elastic-Composite Energy Harvester." Advanced materials 27.18 : pp 2866-2875.

Xu, Feng; et al. (2012) "Highly Conductive and Stretchable Silver Nanowire Conductors." Advanced materials 24.37 : pp. 5117-5122.

Yao, Shanshan; et al. (2014) "Wearable Multifunctional Sensors Using Printed Stretchable Conductors Made of Silver Nanowires." Nanoscale 6.4 : pp. 2345-2352.

Or, S. W.; et al. (2001) "Mode Coupling in Lead Zirconate Titanate/Epoxy 1-3 Piezocomposite Rings." Journal of Applied Physics 90.8 : pp. 4122-4129.

Smith, Wallace Arden; et al. (1991) "Modeling 1-3 Composite Piezoelectrics: Thickness-Mode Oscillations." IEEE transactions on ultrasonics, ferroelectrics, and frequency control 38.1 : pp. 40-47.

Jiang, Xiaoning; et al. (2014) "Relaxor-PT Single Crystal Piezoelectric Sensors." Crystals 4.3 : pp. 351-376.

Johnston, I. D., et al. (2014) "Mechanical Characterization of Bulk Sylgard 184 for Microfluidics and Microengineering." Journal of Micromechanics and Microengineering 24.3 : 035017pp. 1-7.

Cui, Zheng, et al. (2018) "Electrohydrodynamic Printing of Silver Nanowires for Flexible and Stretchable Electronics." Nanoscale 10.15 : pp. 6806-6811.

Lee, Hyeong Jae, et al. (2014) "High Temperature, High Power Piezoelectric Composite Transducers." Sensors 14.8 : pp. 14526-14552.

Tan, Say Hwa, et al. (2010) "Oxygen Plasma Treatment for Reducing Hydrophobicity of a Sealed Polydimethylsiloxane Microchannel." Biomicrofluidics 4.3 : pp. 1-8.

Chang, Wei-Yi, et al. (2015) "Candle Soot Nanoparticles-Polydimethylsiloxane Composites for Laser Ultrasound Transducers." Applied Physics Letters 107.16 : 161903 pp. 1-5.

Kim, Taeyang; et al. (2017) "Transit Time Difference Flowmeter for Intravenous Flow Rate Measurement Using 1-3 Piezoelectric Composite Transducers." IEEE Sensors Journal 17.17 : pp. 5741-5748.

Drinkwater, Bruce W.; et al. (2006) "Ultrasonic Arrays for Non-Destructive Evaluation: A review." NDT & e International 39.7 : pp. 525-541.

Harvey, Gerald, et al. (2009) "Flexible Ultrasonic Transducers Incorporating Piezoelectric Fibres." IEEE transactions on ultrasonics, ferroelectrics, and frequency control 56.9 : pp. 1999-2009.

Wilkie, William Keats, et al. (2000) "Low-Cost Piezocomposite Actuator for Structural Control Applications." Smart structures and materials 2000: industrial and commercial applications of smart structures technologies. vol. 3991. International Society for Optics and Photonics, pp. 1-12.

Melodelima, David, et al. (2009) "Thermal Ablation by High-Intensity-Focused Ultrasound Using a Toroid Transducer Increases the Coagulated Volume. Results of Animal Experiments." Ultrasound in medicine & biology 35.3 : pp. 425-435.

Gen, X., T. A. Ritter; et al. 1999 "1-3 Piezoelectric Composites for High Power Ultrasonic Transducer Applications." 1999 IEEE Ultrasonics Symposium. Proceedings. International Symposium (Cat. No. 99CH37027). vol. 2. IEEE, pp. 1191-1194.

Kim, Jinwook; et al. (2014) "Homogenization of PMN-PT/epoxy 1-3 Piezocomposites by Resonator Measurements and Finite Element Analysis." Sensors and Actuators A: Physical 206 : pp. 97-106.

Sherman, Charles H.; et al. (2007) "Transducers and Arrays for Underwater Sound." vol. 4. New York: Springer, p. 661.

Huang, Qijin, et al. (2015) "Highly Thermostable, Flexible, Transparent, and Conductive Films on Polyimide Substrate with an AZO/AgNW/AZO Structure." ACS applied materials & interfaces 7.7 : pp. 4299-4305.

Wu, Tai Chieh, et al. (2017) "The Use of Flexible Ultrasound Transducers for the Detection of Laser-Induced GuidedWaves on Curved Surfaces at Elevated Temperatures." Sensors 17.6 : pp 1285.

(56) References Cited

OTHER PUBLICATIONS

ANSI/IEE Std, "IEEE standard on piezoelectricity." ANSI/IEE Std, p. 176, 1987.

* cited by examiner

Optical Images (Side View)

Top View

Bottom View

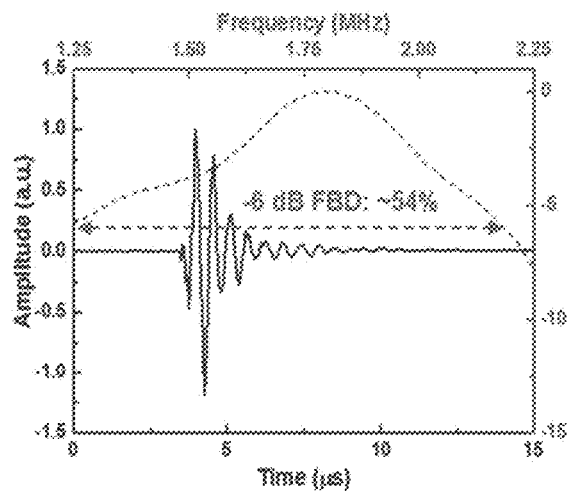
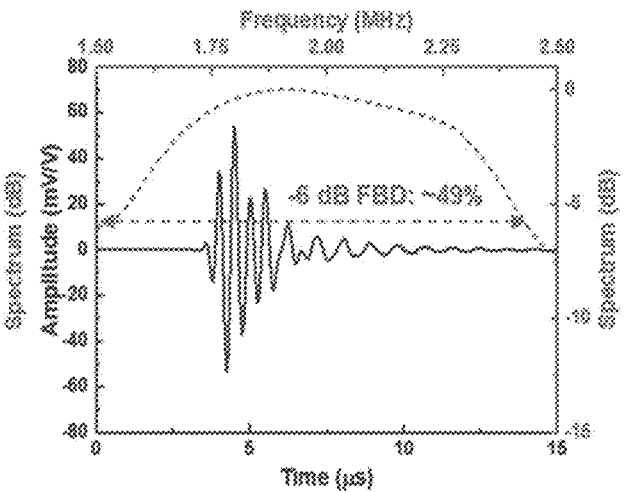
FIG. 12A  FIG. 12B
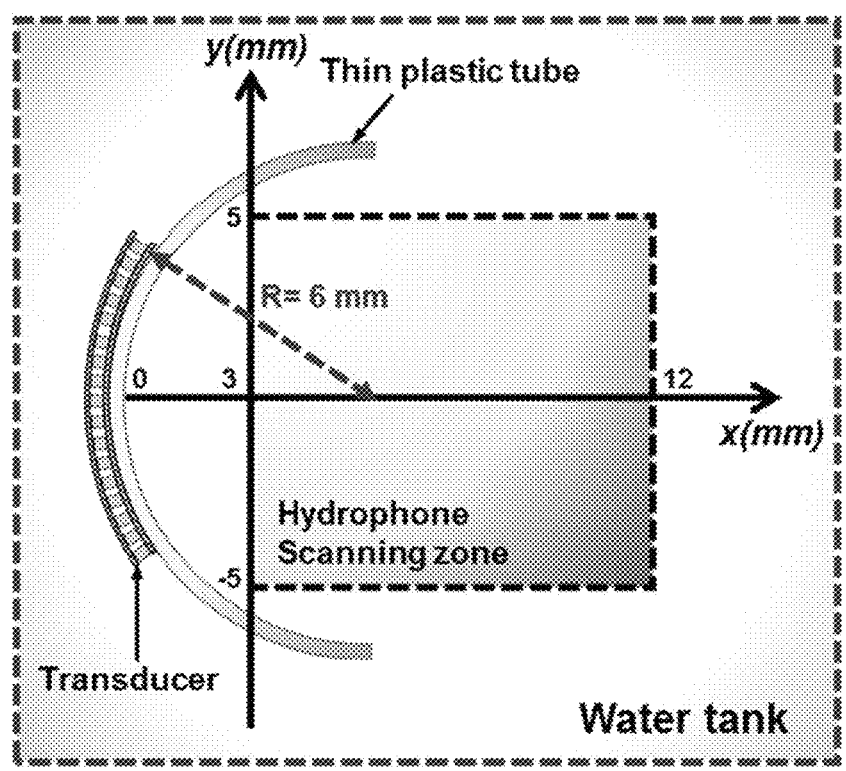
FIG. 13

FLEXIBLE PIEZO-COMPOSITE SENSORS AND TRANSDUCERS

CROSS-REFERENCE TO RELATED APPLICATION

This application claims the benefit of and priority to U.S. Provisional Patent Application No. 62/813,896 entitled "FLEXIBLE PIEZO-COMPOSITE SENSORS AND TRANSDUCERS," filed Mar. 5, 2019, the contents of which being incorporated by reference in their entirety herein.

GOVERNMENT RIGHTS NOTICE

This invention was made with government support under grant number N00014-15-1-2418 awarded by the United States Navy's Office of Naval Research and grant number W911NF-11-1-0516 awarded by the United States Army's Army Research Office. The government has certain rights in the invention.

BACKGROUND

Piezoelectric sensors and ultrasonic transducers are widely used for advanced electronics for displays, radiofrequency (RF) communications, non-destructive testing, and structural health monitoring of biological and industrial structures. Specifically, piezo-composite sensors and transducers have been used in various sectors, such as energy, aerospace, military, medical, and civil sectors. For instance, piezo-composite sensors and transducers have been implemented in pressure sensors, hydrophones, accelerometers, microphones, fingerprint sensors, medical imaging, medical therapy, neuron stimulators, drug delivery triggers, and nondestructive testing (NDT) probes due to their high sensitivity and broad bandwidth. However, most high-performance piezoelectric sensors and ultrasonic transducers are known to include a rigid flat front portion, which limits their applications due to their structural geometry.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIG. 12A is a chart showing pulse excitation response of a transducer from the Krimholtz, Leedom and Matthaei (KLM) model.

FIG. 12B is a chart showing a measured pulse-echo response.

FIG. 13 is a schematic diagram showing an experimental setup for focused effect characterization according to various embodiments.

DETAILED DESCRIPTION

Figure 1:
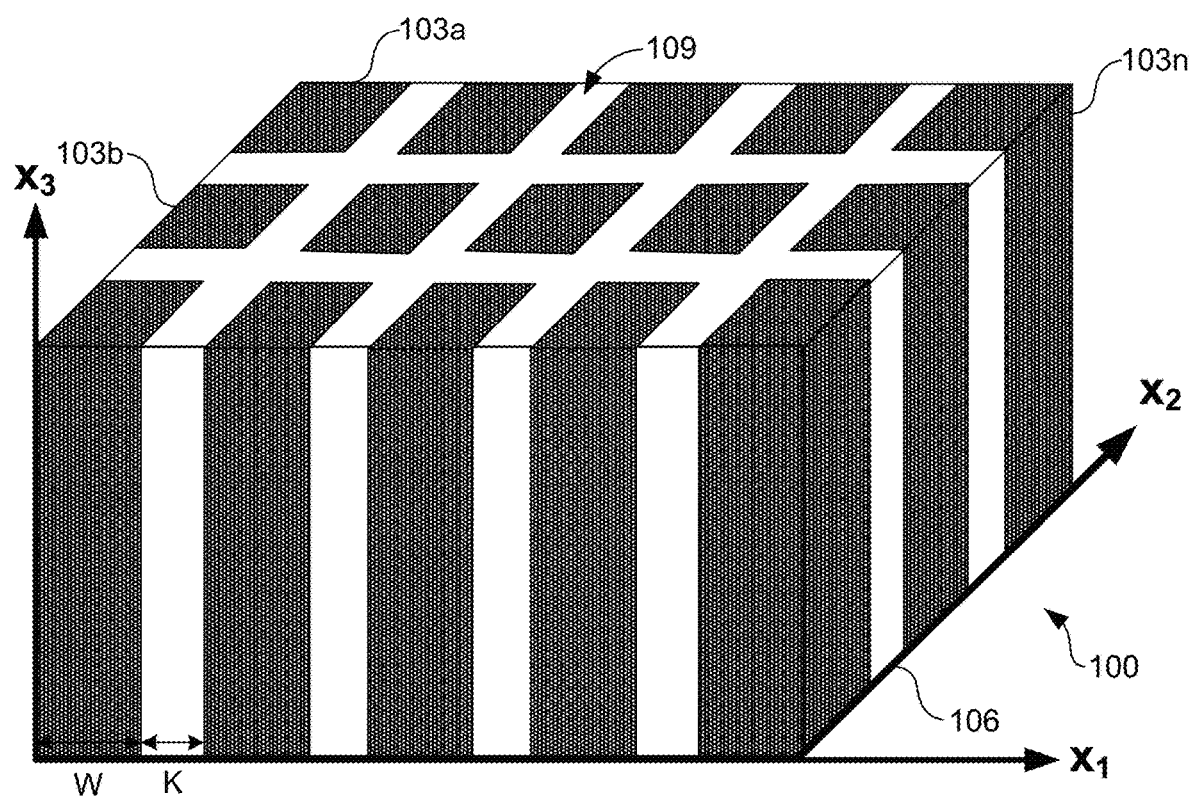
FIG. 1 is a non-limiting example of a flexible piezo-composite transducer according to various embodiments of the present disclosure.

The present disclosure relates to flexible piezo-composite sensors and transducers. As noted above, most high-performance piezoelectric sensors and ultrasonic transducers are known to include a rigid active piezo element portion, which limits the applications of piezoelectric sensors based on their structural geometry. For instance, the rigid active piezo element prohibits piezoelectric sensors and ultrasonic transducers from being well positioned on irregularly shaped structures, such as those not having a flat or curved surface with a fixed radius that does not match with that of the transducer front.

However, there is an increasing interest in flexible electronics. For instance, it can be beneficial for sensors and transducers to be able to attach and conform to curved or irregular shapes such as a vessels, pipes, mammalian skin, appendages, bones, etc. Notably, the flexibility of sensors and transducers can be highly desirable in medical applications. Accordingly, embodiments are described herein for a flexible piezo-composite sensor or transducer that can be implemented in blood flowmeters, humidity sensors, brain stimulators, ultrasound imaging transducers, and similar devices.

According to various embodiments described herein, a flexible piezo-composite sensor or transducer includes an active piezoelectric material, such as lead zirconate titanate (e.g. PZT-5H, PZT-5A, and others), relaxor-PT single crystals (PMN-PT single crystal and PZN-PT single crystal), lead-free piezoelectric materials, or other suitable active piezoelectric material. Further, in various embodiments, the flexible piezo-composite sensor or transducer includes a passive polymer matrix, such as PDMS, that achieves flexibility while providing high performance of electrical insulation. Furthermore, a flexible electrode composite (e.g., silver nanowires and PDMS) can be employed to ensure electrical connections between piezoelectric composite elements and external electronics that do not crack or otherwise impair performance, even under bending conditions.

Ultrasound transducers have been used to visualize internal defects in objects for nondestructive testing (NDT), structural health monitoring (SHM), and medical diagnosis due to their noninvasiveness, high degree of accuracy, great sensitivity, and strong penetration capabilities in a real-time nature. However, ultrasonic transducers often include a rigid active piezoelectric element and, as a result, solid interfacial contact and ideal coupling is not maintainable with irregular nonplanar surfaces. For instance, transducers are often inoperable with various engineering components or parts of the human body and industrial structures, such as a human skull, vessel or pipe, wind turbine blade, and structures of aircrafts. Additionally, these transducers are susceptible to air gaps and poor contacts, which leads to large acoustic energy reflections and wave distortions and unreliable measurements or results.

Flexible sensors or transducers have been studied for various applications. A sputtered piezoelectric thin film on a flexible aluminum foil or stainless steel sheet substrate was introduced as an alternative of a fixed probe transducer. In addition, piezoelectric polymer materials, such as polyvinylidene fluoride (PVDF), were considered as a flexible active material in a transducer. However, these thin-film and polymer-type transducers are not suitable to serve as transmitters because of their relatively low electromechanical coupling coefficients, low dielectric constants, and high dielectric losses. Moreover, PVDF has a low Curie point, making PVDF difficult to process and resulting in phase transformations in high-temperature applications, thereby degrading any piezoelectric properties.

A piezo-ceramic fiber composite (PFC) was developed by combining electromechanical efficiency of PZT with mechanical flexibility. PFC includes thin piezo-ceramic fibers that are aligned uni-directionally, exploiting the use of interdigitated electrodes. PFC delivers a longitudinal piezoelectric effect along the length of fibers. However, it has a limited operation of flexibility because of the metal thin film electrodes. Flexible transducer arrays were also developed by forming polymer-filled deep trenches in flexible silicon substrates. These array transducers, however, have limitations as they give rise to undesirable lateral vibrations which cause cross-talk among the elements of the ultrasound array transducer.

Therefore, in order to overcome the above-described limitations in the state of the art, piezo-polymer 1-3 composites are described herein, which have several advantages over single phase piezoelectric array transducers. The advantages include, for example, flexible substrates that are less susceptible to mechanical damage; reduced lateral vibrations due to the polymer matrix between piezoelectric rods; thermal shaping of the structure being possible to obtain a concave shell; and broad bandwidth. However, conventional single element piezoelectric composite transducers are usually known with a fixed focal length due to the nature of their rigid active piezoelectric element.

Accordingly, various embodiments are described herein for a flexible 1-3 piezoelectric composite transducer with desirable intensity and compliance. Limitations of metal-type electrodes, such as cracking or delamination at the presence of bending, have not been overcome for flexible 1-3 piezoelectric composites. Although thin aluminum foil of steel sheets have been adopted as an alternative flexible common electrodes for array transducers, many technical challenges still exist due to the non-stretchable nature and weak bonding force with active films, which are vulnerable to electrical connection failures. On the other hand, highly flexible, stretchable and conductive silver nanowire (AgNW) electrodes have been demonstrated, in which AgNWs were embedded below the surface of an elastomeric substrate, such as polydimethylsiloxane (PDMS). The AgNW/PDMS electrodes can maintain excellent conductivity at a highly strained state (e.g., >5000 S/cm at 50% tensile strain). In addition, the electrodes can maintain contact with the structural surface, even under motion, because of the flexibility and compliance.

According to various embodiments described herein, a flexible piezo-composite transducer (FPCT) is described having an active piezoelectric material, such as PZT-5H, and a passive polymer matrix formed of a flexible material, such as PDMS. The flexible piezo-composite transducer achieves desirable flexibility, sensitivity, and bandwidth as will be shown herein. The flexible piezo-composite transducer can be applied to regular, curved, and/or irregular surfaces of various structures, detecting presence of defects or acoustic variations on the structures with high sensitivity and sufficient contact. In addition, electrodes described herein, such as those formed of AgNWs and PDMS, provide a notable alternative to metal film-based electrodes, while providing an improved durability and resistance to cracks that occur from strained fatigue and also providing desirable electric conductivity.

In various embodiments, the flexible piezo-composite transducer may include a piezoelectric 1-3 composite in which PZT-5H, PZT-5A, PZT-5J or other piezoelectric materials and PDMS or other similar flexible materials, are adopted as the active and filler materials, respectively, to obtain electrical sensitivity as well as physical flexibility. Also, flexible electrodes with gold or other metal thin films and silver nanowires or other conductive nanowires can be deposited on one or more sides of a piezoelectric 1-3 composite layer to provide sufficient conductivity on the transducers at deflected conditions.

Referring now to FIG. 1, a perspective view of a flexible piezo-composite transducer 100 is shown according to various embodiments. The flexible piezo-composite transducer 100 may include a plurality of composite pillars 103a . . . 103n extending upwardly from a transducer substrate 106. Only a portion of the composite pillars 103 are labeled in FIG. 1 for explanatory purposes. In some embodiments, the composite pillars 103 are 1-3 composite pillars formed of an active 1-3 piezo-electric material, such that the flexible piezo-composite transducer 100 may be referred to as a flexible 1-3 piezo-composite transducer 100. While composite pillars 103 are shown in FIG. 1, in alternative embodiments, the pillars may be formed of a single-phase piezoelectrical material.

Again, individual ones of the plurality of composite pillars 103 may be formed of an active piezo-electric material. In some embodiments, the active piezo-electric material includes a lead zirconate titanate ceramic, such as PZT-5H, PZT-5A, PZT-5J, or other similar ceramic. In other embodiments, the active piezo-electric material includes a piezoelectric single crystals, such as PMN-PT single crystal or PZN-PT single crystal.

The flexible piezo-composite transducer 100 further includes a passive polymer matrix 109 which may be formed in trenches or areas between individual ones of the composite pillars 103. In some embodiments, the passive polymer matrix 109 may be formed of a flexible material positioned between the composite pillars 103. In various embodiments, the flexible material may include PDMS or other material having similar properties.

While not shown in FIG. 1, a first electrode may be positioned on a first side of the flexible piezo-composite transducer 100 and/or a second electrode may be positioned on a second side of the flexible piezo-composite transducer 100. To this end, in some embodiments, each side of the flexible piezo-composite transducer 100 may have a two-layer electrode positioned thereon, such as a metal thin film and silver nanowire composite electrode. The first electrode may include a gold (Au) electrode or other metal thin films and the second electrode may be formed of silver nanowires or other conductive nanowires and PDMS.

In various embodiments, a height of at least a portion of the composite pillars 103 is in a range of approximately 20 μm to 1 mm, a width of the composite pillars 103 is in a range of approximately 10 μm to 500 μm, and a kerf width of the composite pillars 103 is in a range of approximately 3 μm to 150 μm. Further, a thickness of the first electrode is approximately 100 nm to 500 nm and/or a thickness of the second electrode is approximately 5 μm to 50 μm.

In various embodiments, a height of at least a portion of the composite pillars 103 is approximately 1000 μm (e.g., ±250 μm), a width of the composite pillars 103 is approximately 500 μm (e.g., ±100 μm), and a kerf width of the composite pillars 103 is approximately 150 μm (e.g., ±50 μm). Further, a thickness of the first electrode is approximately 100 nm and/or a thickness of the second electrode is approximately 50 μm.

The flexible piezo-composite transducer 100 may be implemented in a pressure sensor, an ultrasound device, a hydrophone, an accelerometer, a medical imaging device, a brain stimulator, a nondestructive testing (NDT) probe, or other device as described herein.

Ultrasonic composites, such as 1-3 composites, are known to have high electromechanical coupling factors (~>0.6-0.85) and low acoustic impedances (<20 kg/(m²s)×10⁶ or 20 MRayl). The associated transducers are also known to have a broad bandwidth (−6 dB fractional bandwidth (FBD): ~70% to 100%). As such, the flexible piezo-composite transducer 100 described herein may include target properties of an electromechanical coupling factor (~0.68), a center frequency (~2 MHz), FBD (~60%), and an acoustic impedance less than 20 MRayl. However, a range of frequencies from 1 MHz to 60 MHz can be employed.

Figure 2:
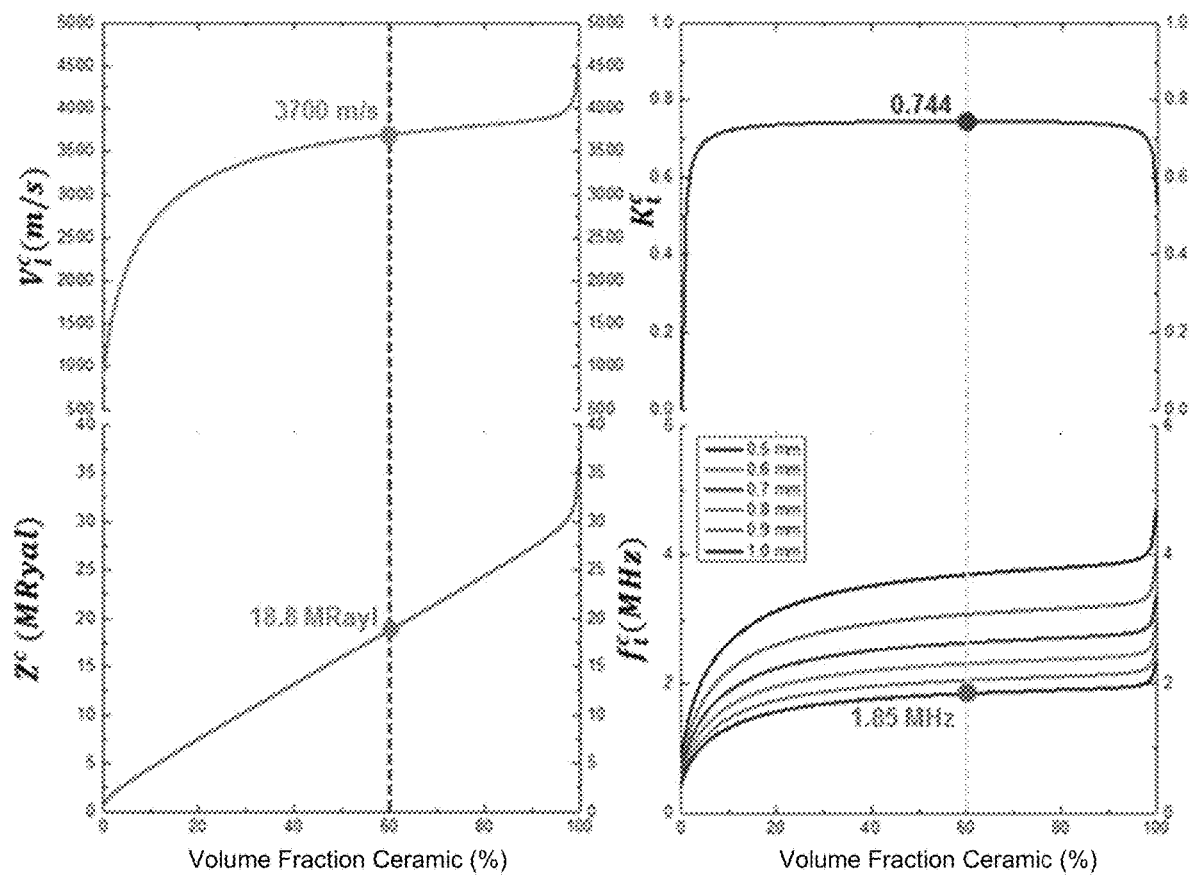
FIG. 2 is a chart showing variation of effective properties of a 1-3 piezo-composite transducer as a function of volume fractions according to various embodiments of the present disclosure.

The effective medium model (EMM) was employed in design of the flexible piezo-composite transducer 100, which is based on the assumption that a composite is a homogeneous medium with new effective material parameters, so long as the pillar size and kerf spacing are comparatively fine to all relevant acoustic wavelengths. Based on the calculations with the effective medium model, ideal 1-3 composite properties were determined, such as coupling coefficient (k), acoustic impedance (Z), and thickness resonance frequency ($f_r$) as a function of volume fraction, as shown in FIG. 2. The derivation can be conducted by considering the properties of active piezoelectric material (e.g., PZT-5H) and polymer matrix (e.g., PDMS). The effective properties of a 1-3 piezo-composite as described herein are summarized in Table 1 below:

TABLE 1

MATERIAL PROPERTIES OF PZT-5H AND PDMS AND AGGREGATED 1-3 COMPOSITE

|  | PZT-5H | Epoxy | 1-3 composite* |
|---|---|---|---|
| $c_{11}^D$ ($10^{10}$ N/m²) | 11.7 | 0.087 | 7.05 |
| $c_{12}^D$ ($10^{10}$ N/m²) | 7.02 | 0.036 | — |
| $c_{13}^D$ ($10^{10}$ N/m²) | 6.09 | — | — |
| $c_{33}^D$ ($10^{10}$ N/m²) | 14.1 | — | 6.95 |
| $\rho$ (kg/m³) | 7750 | 1070 | 5078 |
| $\varepsilon_{33}^S/\varepsilon_0$ | 1700 | 3 | 1007 |
| $k_{33}$ (%) | 75 | — | — |
| $k_t$ (%) | 52 | — | 74 |

*Parameters in the condition with volume fraction of 60%

FIG. 2 shows the desired properties and performance of an example 1-3 composite transducer, such as the thickness-mode electromechanical coupling coefficient ($k_t$>70%), the acoustic impedance (Z<20 MRayl), and the thickness resonance frequency ($f_r$≈1.85 MHz), which may be obtained in the condition of the 60% volume fraction of the piezo-ceramic and thickness of the composite (H=1.0 mm). Therefore, based on the mode-coupling theory, where G (=W/H) <0.5, the width of the piezo-ceramic material (=W) may be selected to be less than 0.5 mm and the kerf width (=K) may be selected to be approximately 0.15 mm, thereby obtaining a 60% volume fraction of composite.

To have a transducer that can be implemented in various applications, it is desirable that the transducer be able to flex or otherwise transform to conform to an irregular shaped surface of structures. Furthermore, a flexible transducer should exhibit sufficient robustness to the external deflection force to prevent structural failure such as delamination inside 1-3 composites. Thus, the structural stresses induced in the PZT-5H and PDMS elements, as an example, were analyzed and the maximum load that can be applied on the transducer during application was evaluated by using the commercial Finite Element Analysis (FEA) package by ANSYS®. For simplicity of the simulations, 2D FEA was adopted. The loads were applied on the bottom face of the transducer elements by considering the allowable fracture strength of the PZT-5H and PDMS to be 13.79 MPa and 5.13 MPa, respectively.

Figure 3A:
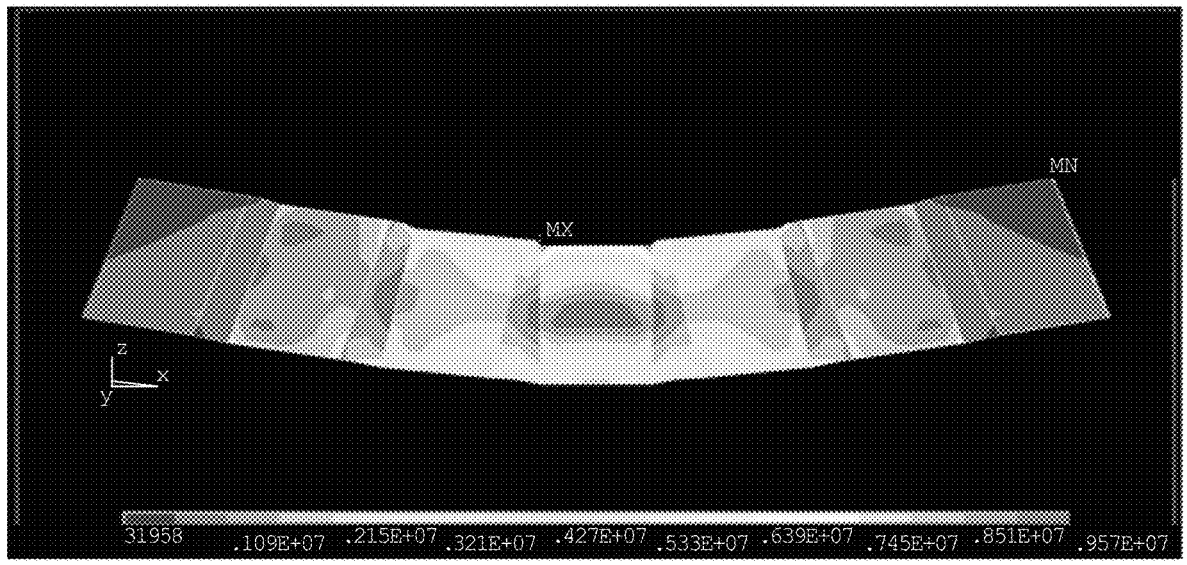
FIG. 3A shows normal stress concentration on the 1-3 piezo-composite in which maximum stress occurs at the middle of the element.
Figure 3B:
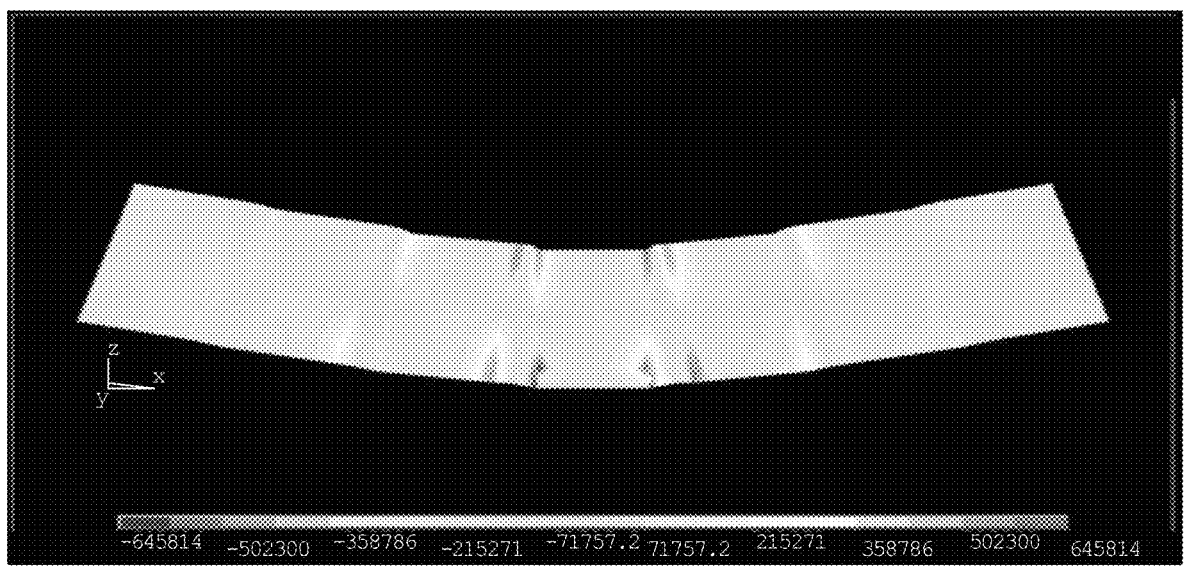
FIG. 3B shows shear stress distribution where maximum shear stress can be found at the middle of the structure.

Bond forces between the active pillar and passive filler materials should be sufficient to endure the deflection-induced delamination. Thus, the stress concentration between the elements were investigated using Von Mises Criterion and FEA. FIG. 3A shows the normal stress concentration on the 1-3 composite in which the maximum stress (~9.57 MPa) occurs at the middle of the element. Shear stress distribution is shown in FIG. 3B. The maximum shear stress (~0.64 MPa) is found at the middle of the structure, specifically at the interface between the PZT-5H pillar and the PDMS filler, as expected. However, all of the stresses exhibited in the composite are below the allowable permissible stress values of the PZT-5H and PDMS. However, this embodiment is one of other potential embodiments described herein.

Figure 4:
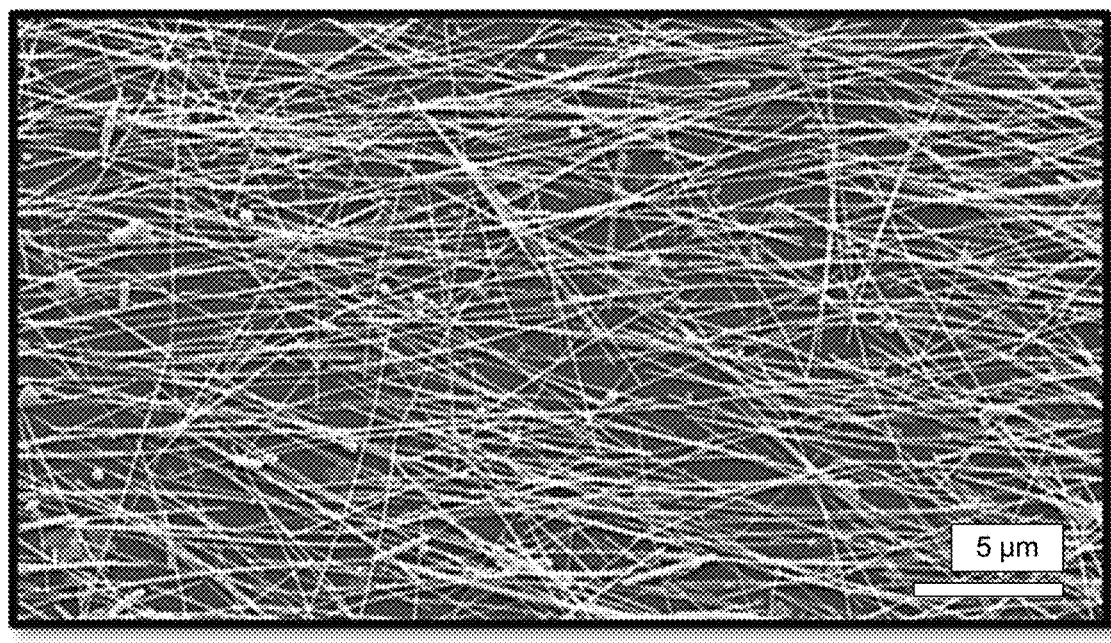
FIG. 4 is a scanning electron microscope (SEM) image of a film of silver nanowires on a transducer.

In accordance with various embodiments described herein, silver nanowires may be synthesized by a modified polyol reduction process. Fabricated silver nanowires may be diluted in deionized (DI) water at a concentration of 5 mg/ml. Laponite RDS, which is a synthetic clay made of nanometer-sized discotic platelets, may be added to the deionized water with a concentration of 2.5 mg/ml. The clay solution and silver nanowire dispersion may be mixed together with the AgNW/clay weight ratio of 2:1. The prepared AgNW ink may be then spray-coated on the transducer using an air brush (e.g., Iwata 4292 HI-LINE KUSTOM). The back pressure may be set at 10 psi and the spray distance may be ~5 cm, or other suitable parameters. A heater may be employed to heat up the transducer to 60° C. during the spray coating to speed up solvent evaporation. FIG. 4 shows a top-view scanning electron microscope (SEM) image of a coating of silver nanowires on the transducer, where a dense network of randomly oriented silver nanowires can be seen. The silver nanowires had an average diameter of ~90 nm and lengths in the range of 10-60 μm, but may employ other suitable diameters and lengths.

Figure 5:
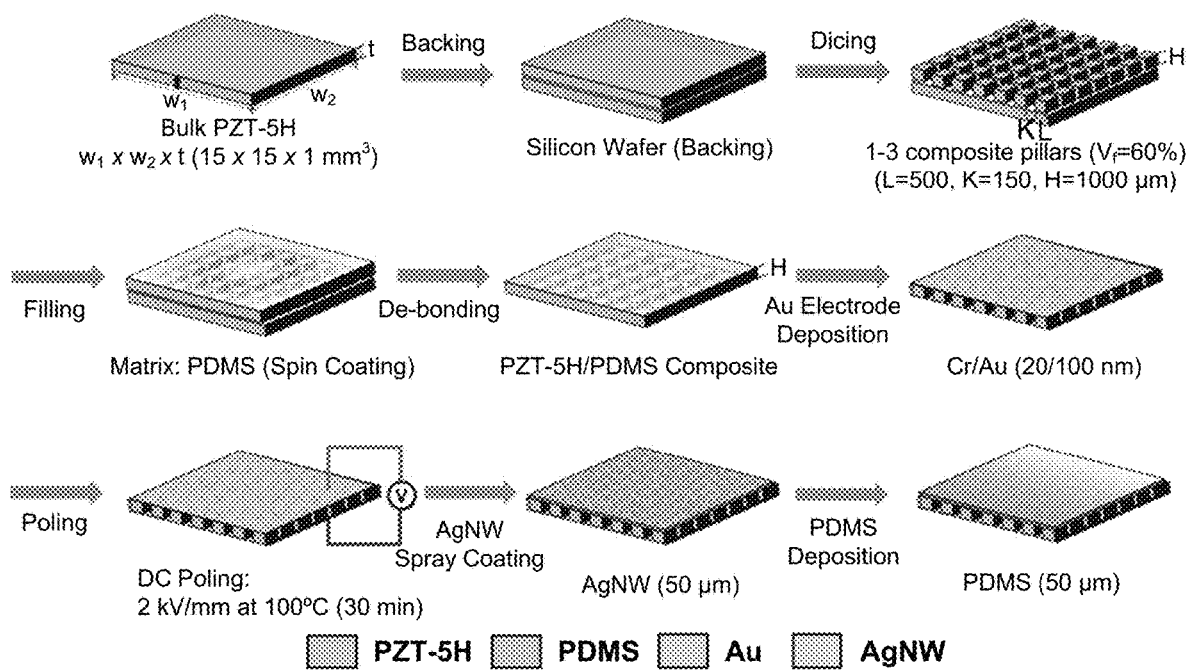
FIG. 5 is a flow diagram illustrating an example fabrication process of a flexible 1-3 composite transducer.

According to the simulated design parameters, 1-3 composite transducers 100 may be fabricated by the "dice and fill" method, laser dicing, plasma etching process, or other suitable process. A non-limiting example of a fabrication process of a flexible 1-3 composite transducer 100 is schematically illustrated in FIG. 5. First, the bulk PZT-5H, or other desired active material, may be bonded to a substrate, such as a silicon wafer, for instance, using a wax to prevent any loss of PZT pillars during a dicing process. Second, a 150-μm-thick dicing saw (DISCO, Japan) may be used to dice the PZT-5H ceramic. Third, the diced ceramic may be processed using an oxygen plasma method so that the adhesion forces between the surfaces of PZT-5H ceramic and cured PDMS can be enhanced. Fourth, oxygen can be used to clean the surfaces of ceramic prior to bonding. Fifth, liquid PDMS (Sylgard 184, Dow Corning) with the weight ratio of base to curing agent of 10:1 can then be used to fill the diced trenches with the spin coating technique (e.g., approximately 2000 rpm for about 2 min.) to achieve a desired flatness on the transducer. Sixth, the substrate, such as a silicon wafer, may be de-bonded from the transducer using a hot plate, for example. Finally, a first electrode (e.g., a gold electrode) and a second electrode (e.g., a silver nanowire and PDMS electrode) can be subsequently deposited on both sides of the transducer to achieve certain thicknesses (e.g., 100 nm and 50 μm, respectively).

Figure 6A:
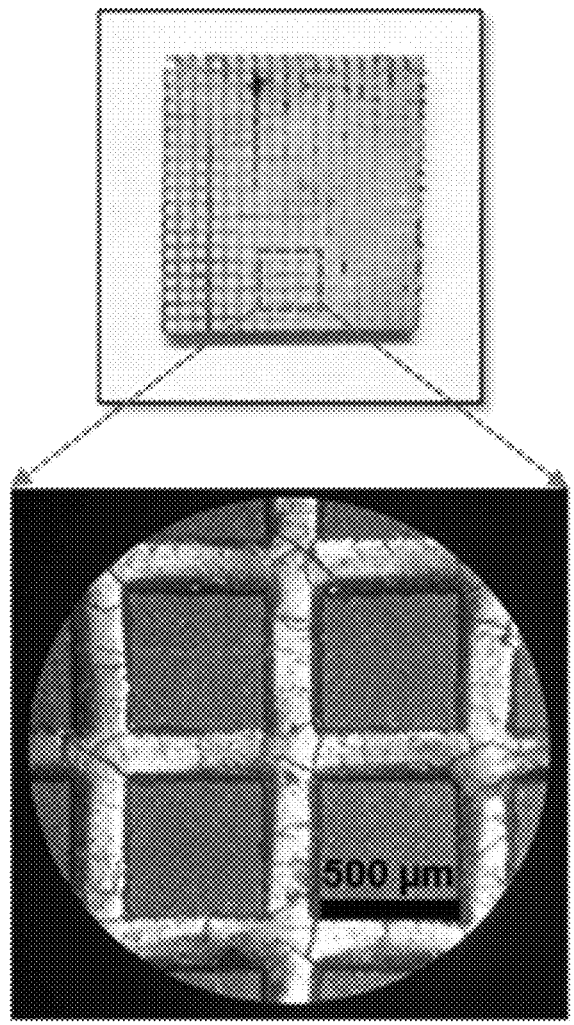
FIG. 6A is an optical image of PZT-5H/PDMS 1-3 composite after deposition of a gold electrode.
Figure 6B:
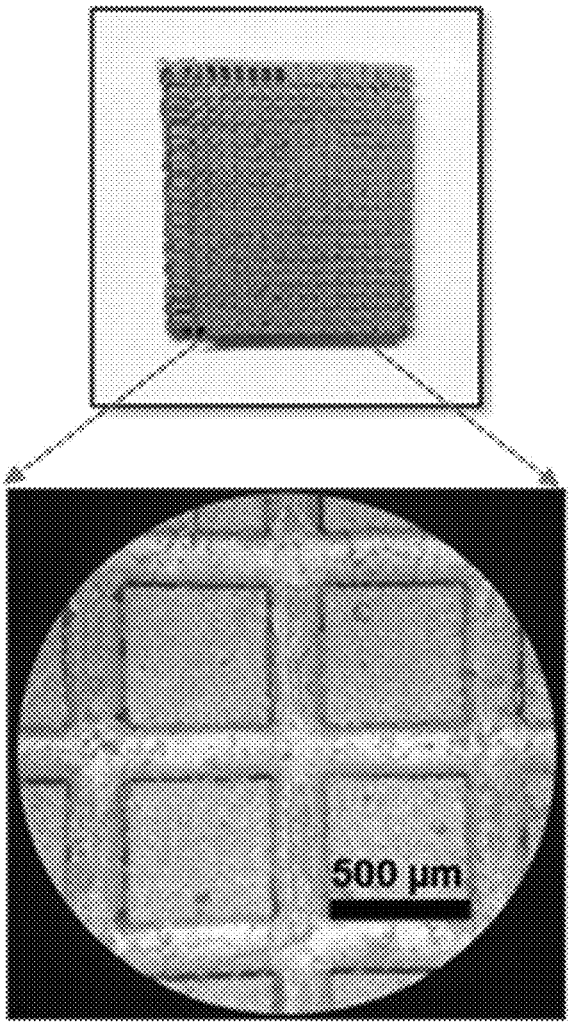
FIG. 6B is an optical image of PZT-5H/PDMS 1-3 composite after deposition of silver nanowires.

Referring now to FIGS. 6A-6B, an optical image of the PZT-5H/PDMS 1-3 composite is shown after deposition of the gold electrode and the silver nanowire and the PDMS electrode. Comparing the conductivity of electrodes before and after the deposition of the silver nanowires, the silver nanowires and PDMS electrode exhibit a sufficiently low resistance (e.g., <5 Ohm) as an electrode.

Figure 7:
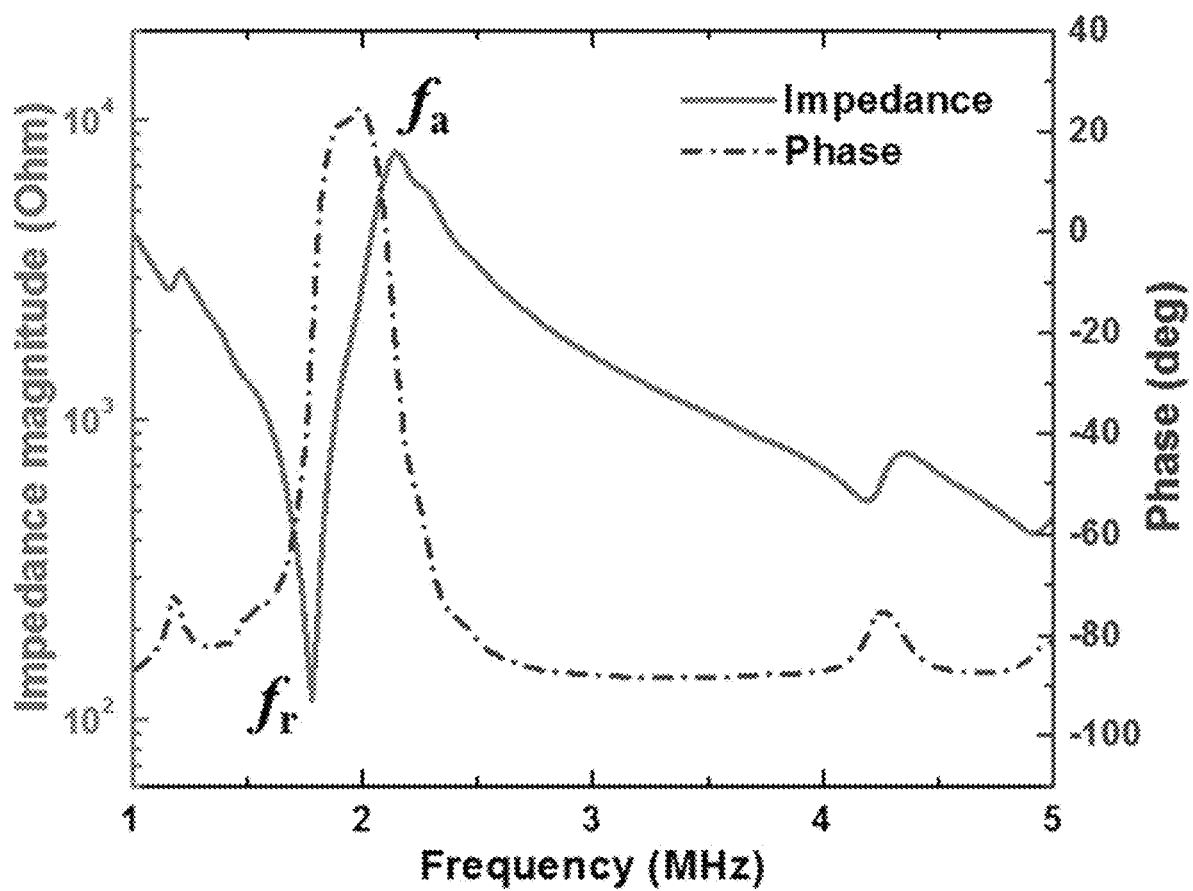
FIG. 7 is a chart showing measured impedance and phase angle spectra for the PZT-5H/PDMS 1-3 composite plate without deformation.

An impedance analyzer (Agilent 4294A, Santa Clara, Calif.) was employed to measure the frequency dependence of electrical parameters (e.g., electrical impedance and phase) of the 1-3 composites. The electromechanical coupling coefficient (kt), acoustic velocity (c), and acoustic impedance (Z) were calculated from the measured spectra shown in FIG. 7, according to the IEEE standards on piezoelectricity, using the following formulae:

$$k_t = \sqrt{\frac{\pi}{2}\frac{f_r}{f_a}\tan\left(\frac{\pi}{2}\frac{f_a - f_r}{f_a}\right)}, \quad \text{(eq. 1)}$$

where $f_r$ and $f_a$ are resonance and anti-resonance frequencies, respectively, as shown in FIG. 7. The acoustic impedance, Z, can be measured via:

$$Z = \rho c = \rho * 2t * f_a \quad \text{(eq. 2)},$$

where ρ is the density, c is the acoustic velocity, and t is the thickness of the sample. The measured and simulated properties of the 1-3 composite are compared in Table 2 below:

TABLE 2

MEASURED AND SIMULATED PROPERTIES OF THE PZT-5H/PDMS 1-3 COMPOSITE

|  | V (%) | $f_t$ (MHz) | $k_t$ (%) | Z (MRayl) | $\varepsilon_r$ |
|---|---|---|---|---|---|
| Measured | 60 | 1.7 | 73.6 | 19.2 | 897 |
| Simulated | 60 | ~1.85 | ~74 | ~18.8 | 1007 |

The fabricated PZT-5H/PDMS 1-3 composite shows the electromechanical coupling coefficient (~0.74), acoustic impedance (<20 MRayl), and volume fraction of ceramic (60%) that are comparable with the simulated values in which the lower measured $f_t$ might attribute to the spurious resonance peak around 2.3 MHz coming from the inhomogeneous flatness of the 1-3 composite.

Figure 8A:
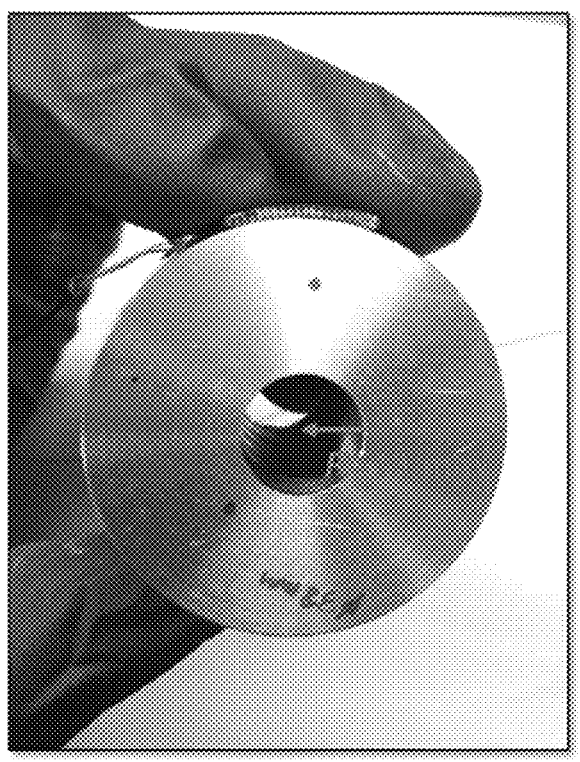
FIG. 8A is a photograph showing a compressive bending test on a 19 mm curvature specimen.
Figure 8B:
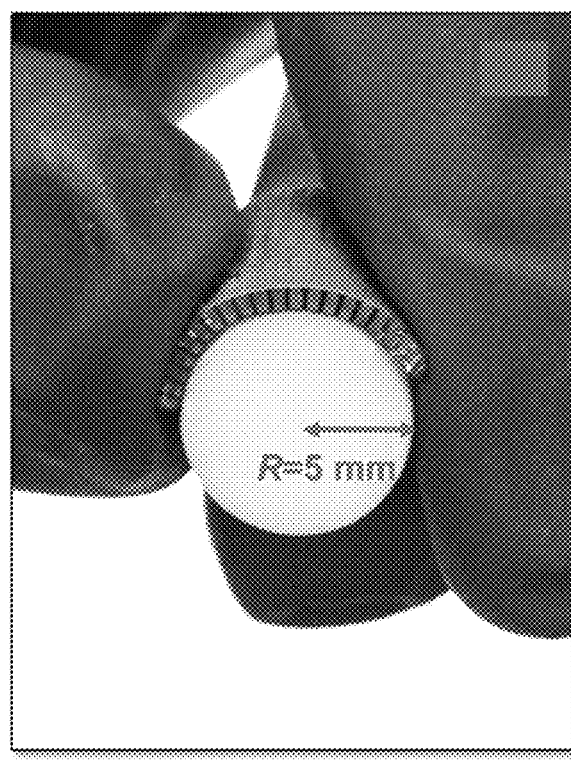
FIG. 8B is a photograph showing a compressive bending test on a 5 mm curvature specimen.
Figure 9:
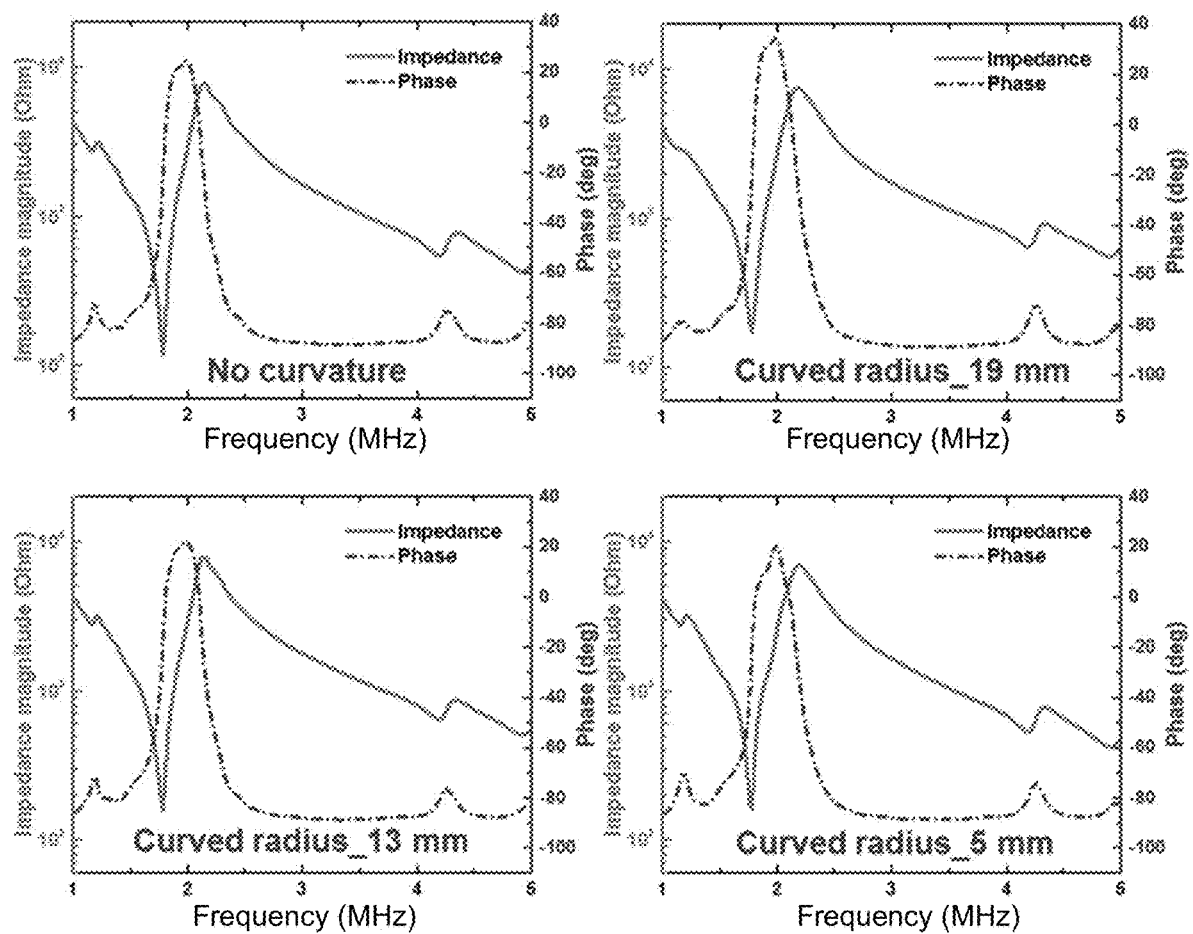
FIG. 9 is a chart showing impedance and phase spectra difference in bending conditions with a different radius.

To demonstrate the flexibility of the fabricated 1-3 composites, a bending deformation was applied to the fabricated devices on the cylindrical surfaces with different radii of the curvature (e.g., R=5, 13 and 19 mm), as shown in FIGS. 8A and 8B. For the bending tests, the flexible 1-3 composite exhibited a complete flexibility to wrap the surface of specimens even on the small radius specimen, as shown in FIG. 8B. To determine the robustness of the transducer, several tests were conducted. Based on the electrical impedance measurement in the curved conditions with different radii of the curvature (e.g., after 10 times repeated loading), there was no difference in impedance spectra and phase difference observed for all cases, as shown in FIG. 9, which indicates that the flexible 1-3 composite did not fail under bending tests.

Figure 10A:
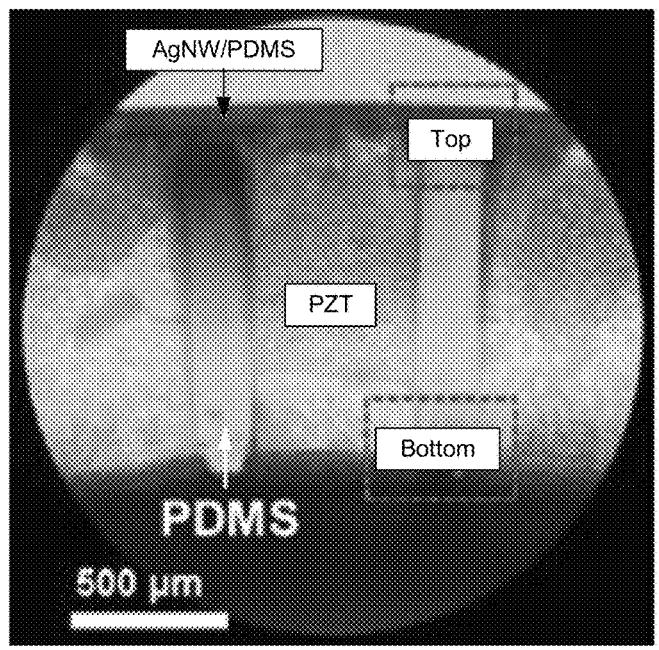
FIGS. 10A-10C include various optical images at an interface between PZT-5H and PDMS.
Figure 10B:
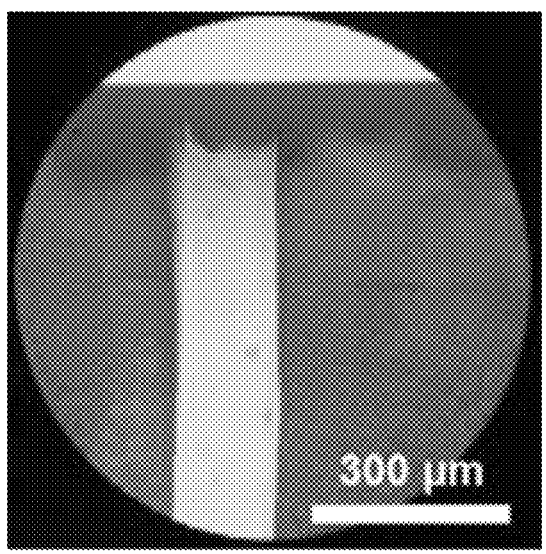
Figure 10C:
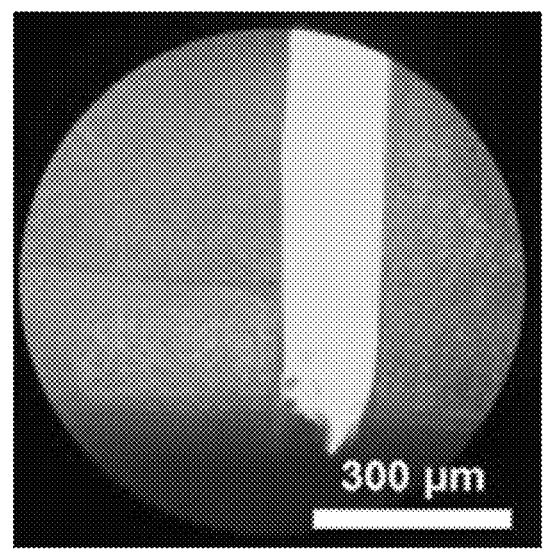

Also, an optical observation (Olympus STM6, Olympus corp., Center Valley, PA) was conducted on the interface between the PZT-5H and PDMS where the maximum stress concentration was expected to be located, according to a stress distribution analysis. As shown in FIGS. 10A-10C, no delamination or cracks can be observed at the top and bottom of the interfaces. These measurements and observations indicate that the flexible 1-3 composite with AgNWs electrodes could endure the excessive bending conditions due to the stretchable mechanical properties of PDMS and the AgNW network.

Figure 11:
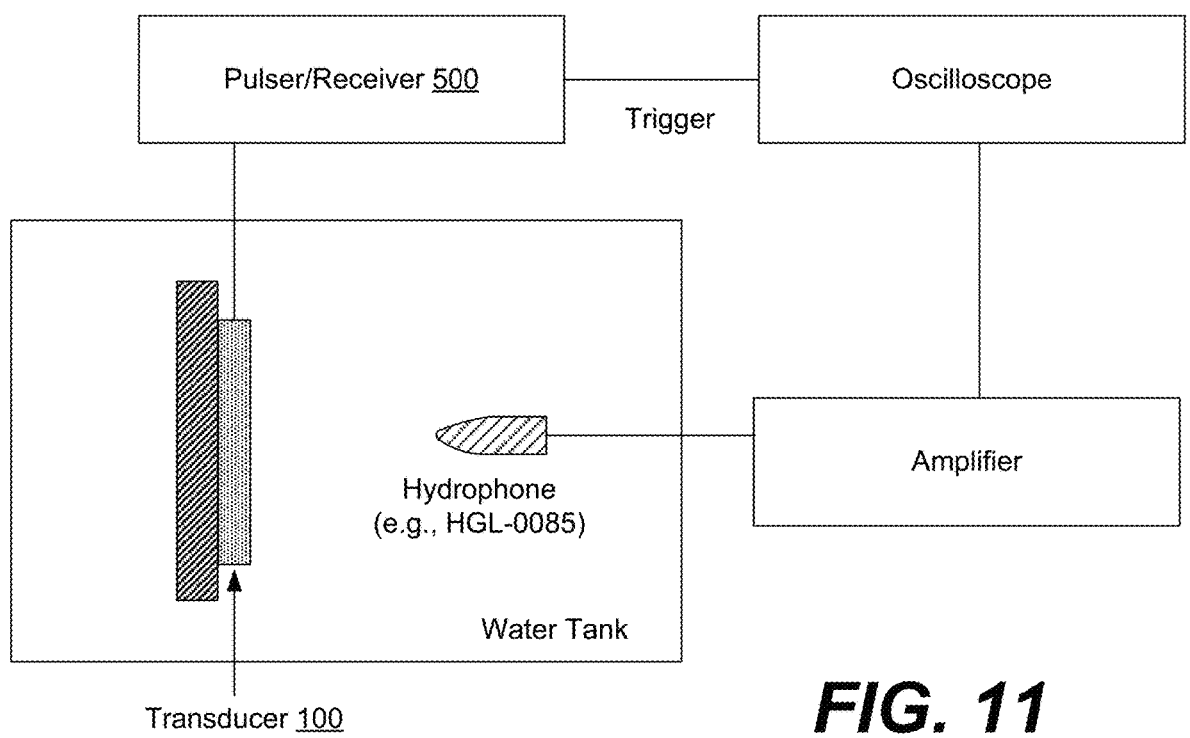
FIG. 11 shows a system for characterizing a focused effect of a transducer according to various embodiments.

The transmitting sensitivity and bandwidth of the flexible piezo-composite transducer 100 described herein were simulated using the Krimholtz, Leedom and Matthaei (KLM) model and verified by the pulse-excitation tests using a hydrophone (HGL-0085, Onda Corp., Sunnyvale, CA). The hydrophone was positioned in front of the flexible piezo-composite transducer 100 and connected to an oscilloscope. The pulse energy of 8 μJ was applied to the transducer from a pulser-receiver 500, as shown in the schematic diagram of FIG. 11.

FIG. 12A represents the simulated pulse-excitation response of the flexible piezo-composite transducer 100. The waveform can be found with a center frequency of ~1.82 MHz and −6 dB fractional bandwidth (FBD) of the excitation signal to be 53.5%. The transmitting sensitivity of the transducers was calculated to be 107 mV/V. Thus, the acoustic characterization results indicate that the 1-3 composite transducers can achieve an acceptable −6 dB FBD and a sufficient transmitting sensitivity for the ultrasonic transducer. FIG. 12B shows the measured transmitting signal of the transducer. Compared with the simulation results, the identical wave forms can be found with a center frequency of about 1.8 MHz and −6 dB fractional bandwidth (FBD) was measured to be 49%, which shows a certain discrepancy with the simulated results due to the unexpected fabrication errors.

Figure 14:
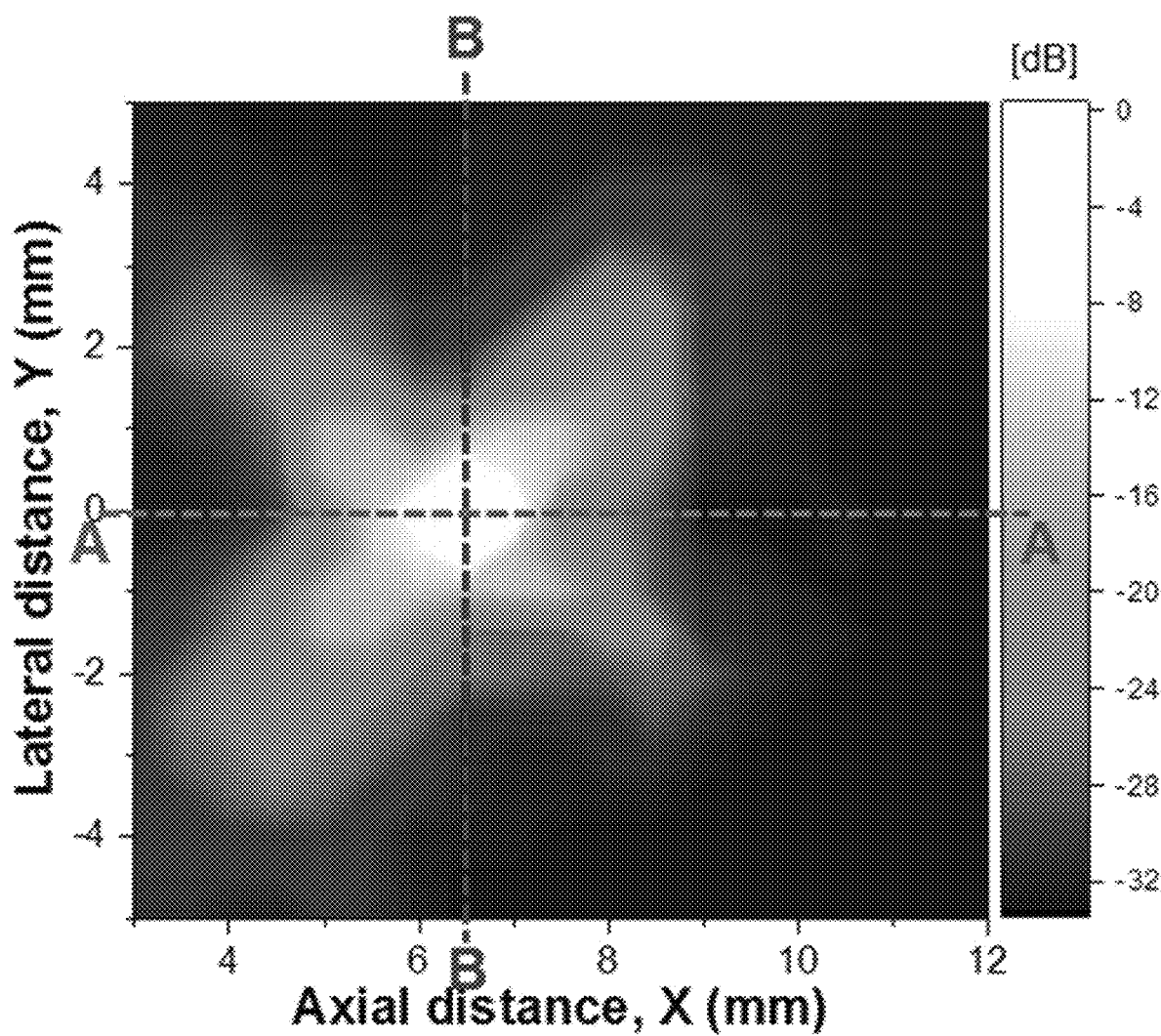
FIG. 14 is a contour map of acoustic pressure distribution in curved conditions.
Figure 15A:
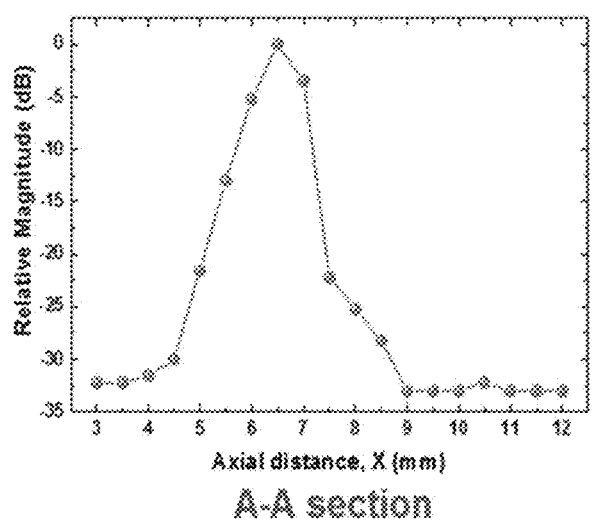
FIG. 15A is a chart showing corresponding relative acoustic pressure magnitudes obtained at the focal point, where x=6.5 mm.
Figure 15B:
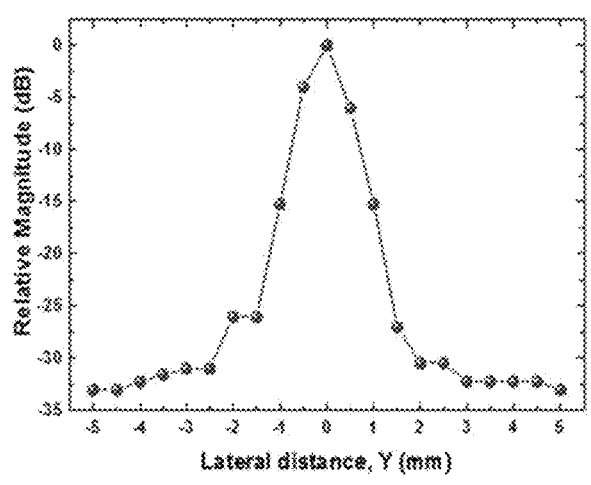
FIG. 15B is a chart showing corresponding relative acoustic pressure magnitudes obtained at the focal point, where y=0 mm.

To characterize the focused effect of the transducer, the transmitted acoustic energy distribution was measured using a hydrophone in the curved condition, as shown in FIG. 13. The hydrophone was moved in the horizontal x-y plane using a 3-axis translation stage. The x-y plane was mapped along the x-axis from 3 to 12 mm, and along the y-axis from −5 to 5 mm with a 0.5-mm step. The envelope of relative magnitude of a signal is plotted on the measurement plane in FIG. 14, and the corresponding profiles obtained at the focal point x=6.5 mm and y=0 mm are plotted, as shown in FIGS. 15A and 15B, respectively. A focal length of 6.5 mm was determined when the amplitude of the ultrasound received by the hydrophone became the maximum value, which is a discrepancy with the designated value of 6 mm. This may occur due to misalignment of the transducer with the hydrophone. However, this result exhibits the well function of the prototyped transducer in the focused ultrasound applications.

Accordingly, in various embodiments, a flexible PZT-5H/PDMS 1-3 composite transducer is described for biomedical sensors and similar applications. The effective medium model and the mode-coupling theory were used to design a 1-3 composite structure. The stress distribution at the interface between the PZT pillar and the PDMS filler was analyzed via FEA, which revealed that all the stresses in the composite are below the permissible stress values. AgNWs/PDMS electrodes were deposited on the transducer to possess a reliable durability to the cracks from the repeated bending tests while providing a sufficient conductivity. The transducer described herein exhibits robust mechanical flexibility and sufficient acoustic performances in the bandwidth (e.g., FBD, ~49%) and sensitivity (e.g., ~107 mV/V) without failure. The focused effect of the transducer was also verified by scanning the x-y plane with hydrophone. These results indicate that the transducer described herein can achieve acceptable performances in sensitivity and bandwidth for the applications to the biomedical sensors.

Figure 16:
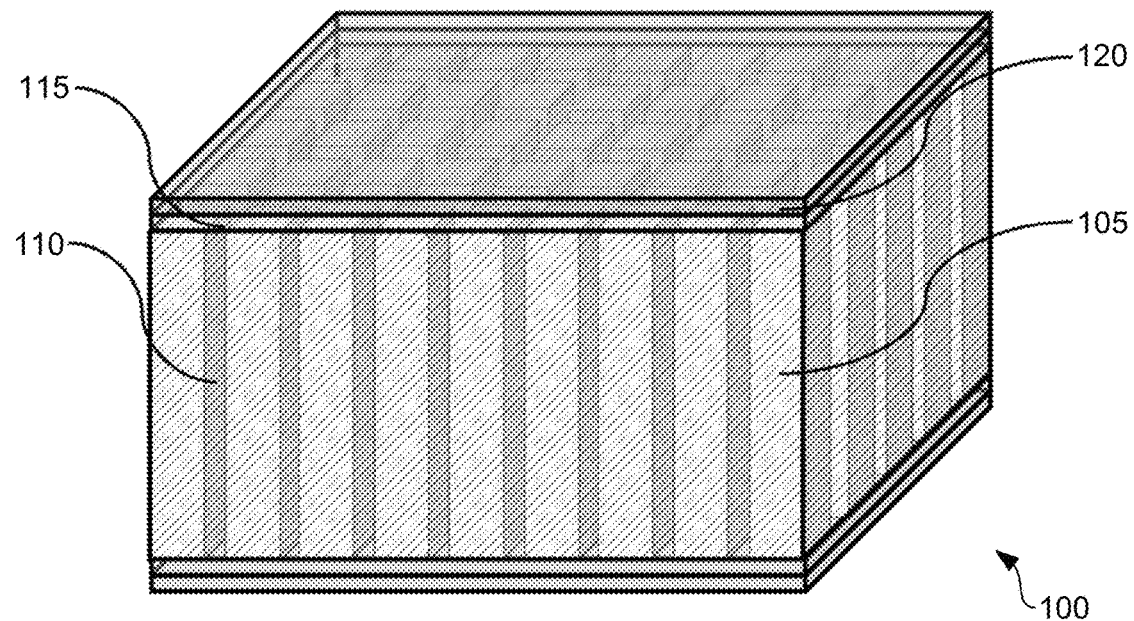
FIG. 16 is an isometric view of a flexible piezo-composite transducer according to various embodiments.
Figure 17:
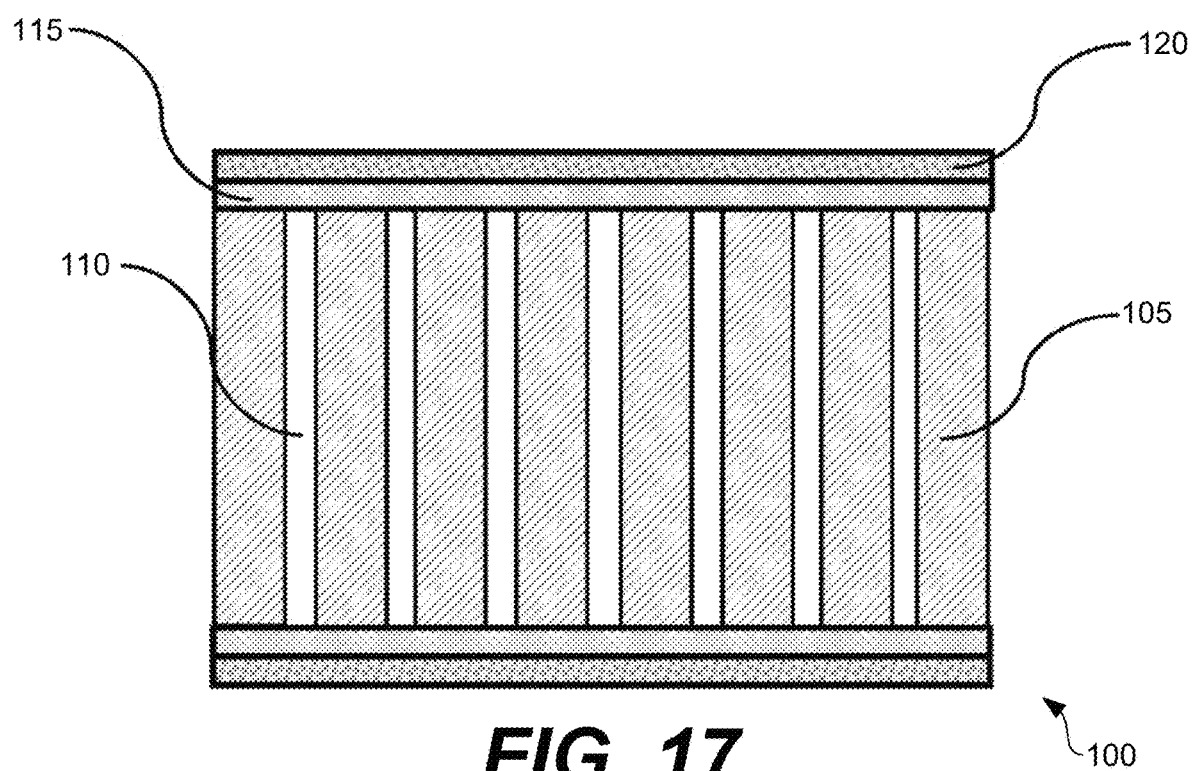
FIG. 17 is a side view of the flexible piezo-composite transducer of FIG. 16 according to various embodiments.

FIG. 16 is an isometric view of a flexible piezo-composite transducer 100 according to various embodiments. FIG. 17 is a side view of the flexible piezo-composite transducer 100 of FIG. 16 according to various embodiments. Referring to these figures collectively, the flexible piezo-composite transducer 100 may include an active piezoelectric material 105, such as PZT-5H, PZT-5A, PZT-5J, or other suitable active material. The flexible piezo-composite transducer 100 may further include a passive polymer matrix 110, such as a PDMS polymer matrix formed in trenches of the active piezoelectric material 105.

The flexible piezo-composite transducer 100 may further include a first electrode 115 and a second electrode 120 positioned on one or both sides of the flexible piezo-composite transducer 100. In some embodiments, the first electrode 115 may include a gold (Au) electrode. Further, in various embodiments, the second electrode 120 may include an electrode formed of silver nanowires and PDMS, such that the second electrode 120 is flexible while having a desirable conductivity.

Figure 18:
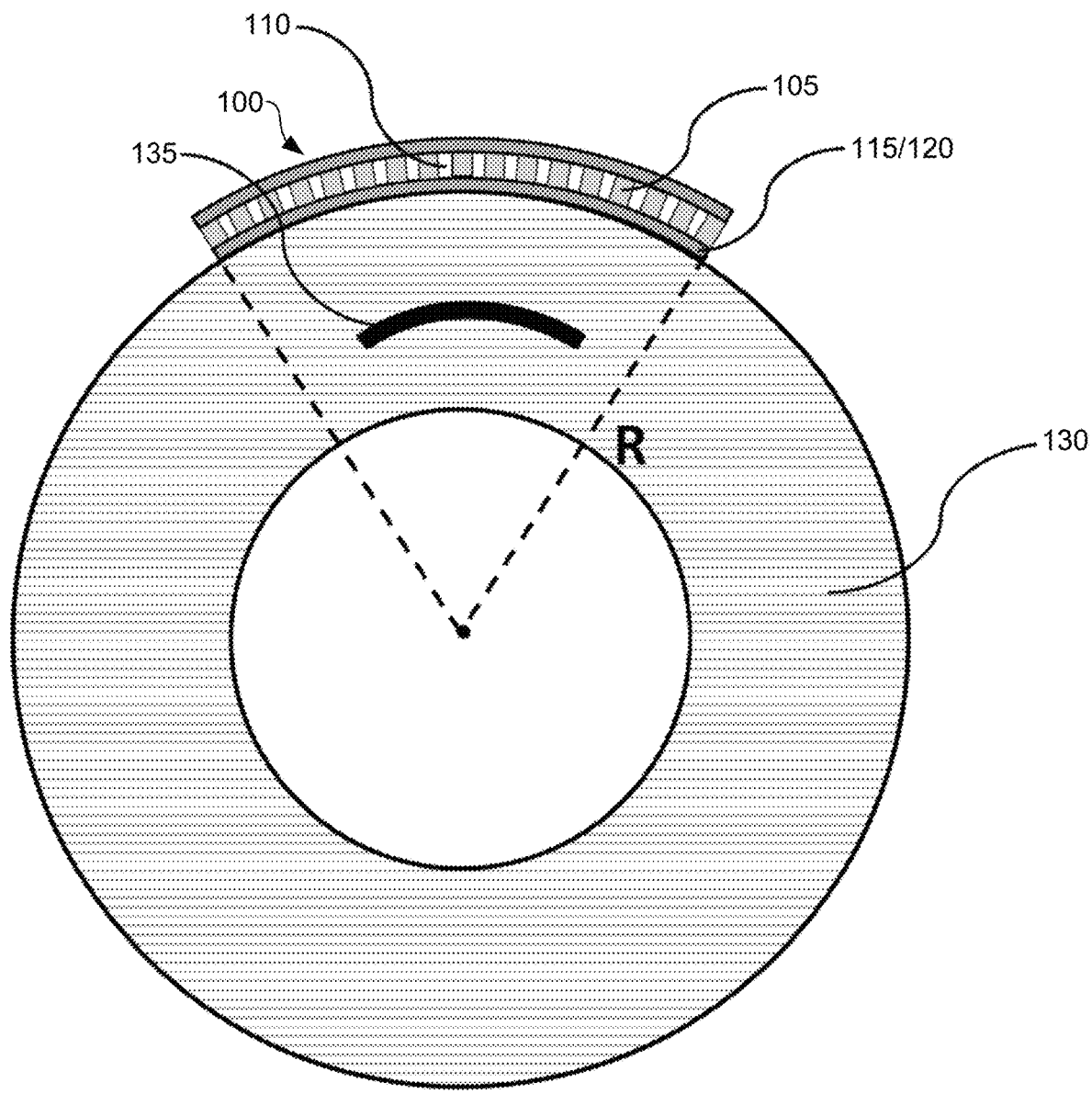
FIG. 18 is a schematic diagram showing application of the flexible piezo-composite transducer of FIG. 16 to a curved structure according to various embodiments.

FIG. 18 is a schematic diagram showing an application of the flexible piezo-composite transducer 100 of FIG. 16 affixed to a curved structure 130 according to various embodiments. A defect 135 is shown on the curved structure 130. However, the flexible piezo-composite transducer 100 conforms to the surface of the curved structure 130.

Figure 19:
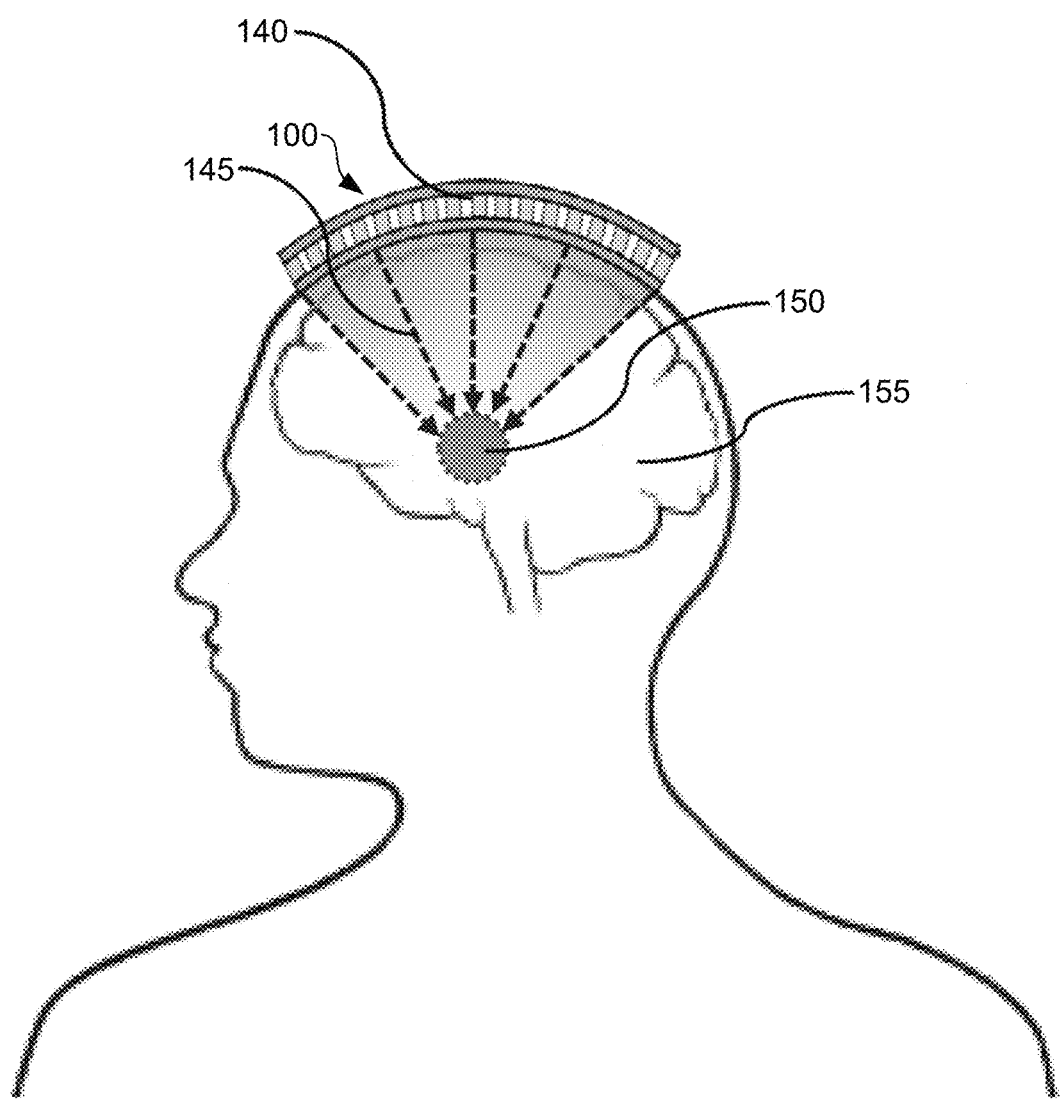
FIG. 19 is a schematic diagram showing an application of a composite transducer for deep brain stimulation according to various embodiments.

FIG. 19 is a schematic diagram showing an application of the flexible piezo-composite transducer 100 to deep brain stimulation according to various embodiments. The flexible piezo-ceramic composite 140 is shown along with an ultrasound wave 145, a stimulated area 150, and a human brain 155. Research into the biological effects of brain stimulation has been performed in order to understand brain behavior correlations and for clinical therapy or diagnosis. Using brain stimulation, it is possible to study brain circuits and modulate brain activity without pharmacological medication. For brain stimulation, various techniques such as deep brain stimulation (DBS), electrical stimulation, optical stimulations, and transcranial magnetic stimulation (TMS) have been widely used and developed. However, these stimulation methods are invasive, and have poor spatial resolution and low penetration depth. Even though deep brain stimulation with an electrode enables stimulation with high spatial resolution, this stimulation method requires an invasive surgical process. As an alternative technique, a non-invasive stimulation method, such as transcranial magnetic stimulation (TMS) or transcranial direct current, may be employed. However, these kind of non-invasive methods showed poor spatial resolution of about one centimeter.

To overcome these limitations, ultrasound stimulation has been extensively studied as a new promising method for treatment of brain diseases and because the ultrasound wave can be transmitted with low transmission loss inside a solid structure such as bone and soft tissues. For instance, it is reported that a transcranial ultrasound wave could stimulate a brain using a conventional ultrasonic transducer. Accordingly, in various embodiments herein, the flexible piezo-composite transducer 100 may be implemented in a brain stimulation device or an ultrasound device.

Figure 20:
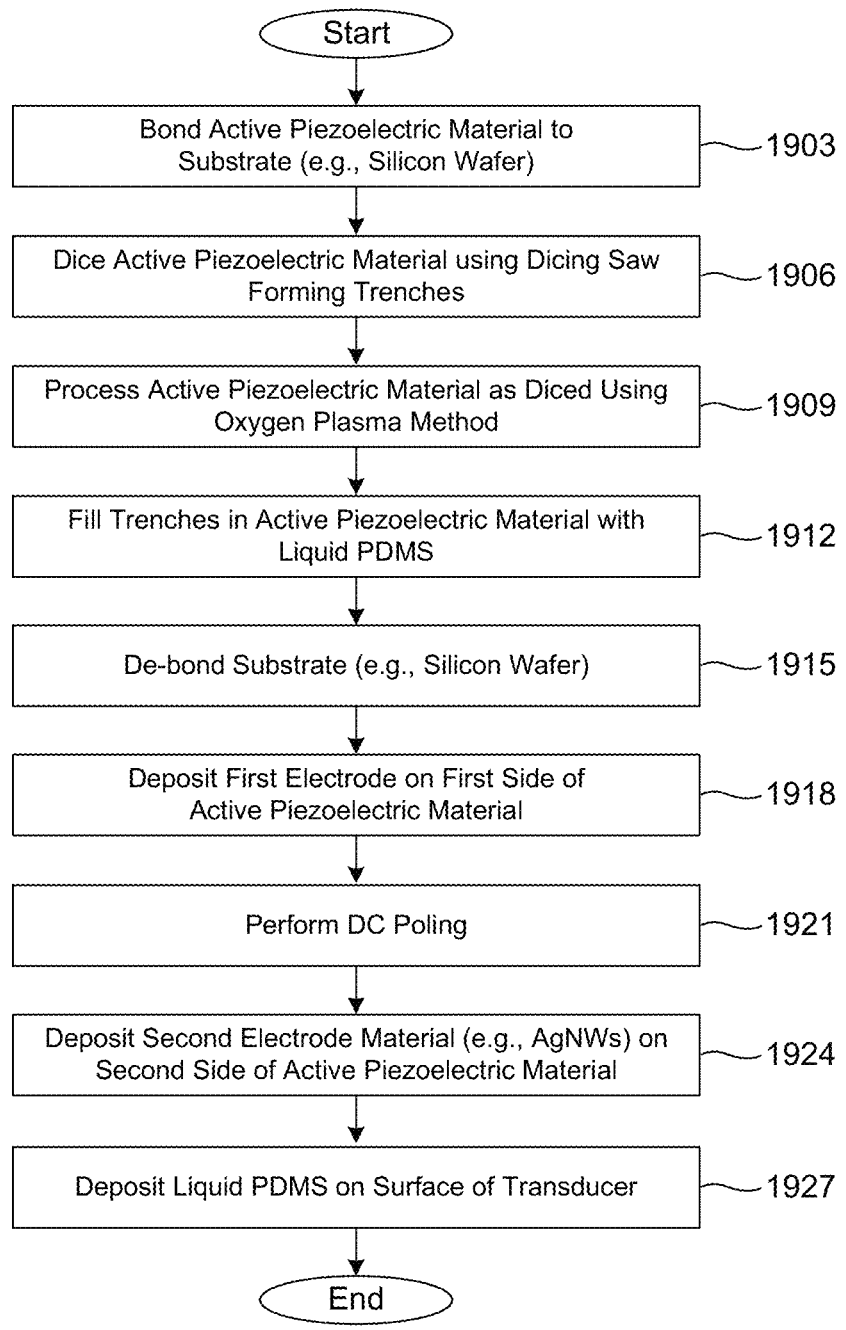
FIG. 20 is a flowchart showing an example formation of a flexible piezo-composite transducer according to various embodiments.

FIG. 20 is a flowchart showing an example of a method for forming a flexible piezo-composite transducer 100 according to various embodiments. The method may include bonding an active piezoelectric material to a substrate, such as a silicon wafer (step 1903), dicing the active piezoelectric material using a dicing saw (step 1906) to form composite pillars 103 (e.g., 1-3 composite pillars), processing the active piezoelectric material as diced using an oxygen plasma method (step 1909), filling a plurality of trenches in the active piezoelectric material (trenches of the composite pillars) as diced with a liquid curing polymer, such as polydimethylsiloxane (step 1912), de-bonding substrate from the active piezoelectric material as filled (step 1915). In some embodiments, the method may further include depositing a first electrode on at least one side of the active piezoelectric material as filled (step 1918), DC or AC poling the active piezoelectric material and the first electrode with 2 kV/mm at 100° C. for 30 min. (step 1921), and depositing a second electrode on at least one side of the active piezoelectric material as filled (step 1924). The second electrode may include a silver nanowire (AgNW) and PDMS electrode which, in some embodiments, may be deposited on the surface of piezoelectric material as filled (step 1927). The active piezoelectric material may include PZT-5H, PZT-5A, PZT-5J, or other suitable active piezoelectric materials in some embodiments. In various embodiments, the first electrode may include a gold (Au) electrode, whereas the second electrode may include a silver nanowire and PDMS electrode. In some embodiments, the active piezoelectric material may be bonded to the substrate (e.g., the silicon wafer) using a wax.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A system, comprising:
a flexible 1-3 piezo-composite transducer comprising:
a plurality of 1-3 composite pillars extending upwardly from a transducer substrate, individual ones of the plurality of 1-3 composite pillars formed of an active piezo-electric material, the active piezo-electric material comprising lead zirconate titanate (PZT-5H) ceramic; and
a passive polymer matrix formed of a flexible material positioned between the plurality of 1-3 composite pillars, the flexible material comprising polydimethylsiloxane (PDMS);
a first electrode positioned on each side of the flexible 1-3 piezo-composite transducer; and
a second electrode positioned on each side of the flexible 1-3 piezo-composite transducer;
wherein the second electrode is a single layer composite formed of silver nanowires and PDMS.

2. The system of claim 1, wherein:
of the first electrode is a metal thin film electrode.

3. The system of claim 1, wherein:
a height of at least a portion of the plurality of 1-3 composite pillars is from approximately 20 pm to 1000 pm;
a thickness of the first electrode is from approximately 100 nm to 500 nm; and
a thickness of the second electrode is from approximately 5 pm to 50 pm.

4. The system of claim 1, wherein the flexible 1-3 piezo-composite transducer is implemented in a pressure sensor, an ultrasound device, a hydrophone, an accelerometer, a medical imaging device, a brain stimulator, or a nondestructive testing (NDT) probe.

5. A flexible piezo-composite transducer, comprising:
a plurality of composite pillars extending upwardly from a transducer substrate, individual ones of the plurality of composite pillars formed of an active piezo-electric material;
a passive polymer matrix formed of a flexible material positioned between the plurality of composite pillars, and
one or more electrodes positioned on each side of the transducer,
wherein at least one of the one or more electrodes is a single layer composite formed of silver nanowires and PDMS.

6. The flexible piezo-composite transducer of claim 5, wherein the active piezoelectric material comprises one of: a lead zirconate titanate (PZT) ceramic and a piezo-electric single crystal.

7. The flexible piezo-composite transducer of claim 6, wherein the active piezoelectric material comprises the piezo-electric single crystal, the piezo-electric single crystal being PMN-PT single crystal or PZN-PT single crystal.

8. The flexible piezo-composite transducer of claim 6, wherein the active piezoelectric material comprises the PZT ceramic and the PZT ceramic is one of: PZT-5H, PZT-5A, and PZT-5J.

9. The flexible piezo-composite transducer of claim 5, wherein the flexible material of the passive polymer matrix comprises polydimethylsiloxane (PDMS).

10. The flexible piezo-composite transducer of claim 5, wherein the one or more electrodes comprise:
a first electrode and a second electrode positioned on each side of the flexible piezo-composite transducer; and
wherein the second electrode on each side of the flexible piezo-composite transducer is the single layer composite formed of silver nanowires and PDMS.

11. The flexible piezo-composite transducer of claim 10, wherein:
the first electrode comprises a Ti/Au electrode or a Cr/Au electrode.

12. The flexible piezo-composite transducer of claim 1, wherein the flexible piezo-composite transducer is implemented in a pressure sensor, an ultrasound device, a hydrophone, an accelerometer, a medical imaging device, a brain stimulator, or a nondestructive testing (NDT) probe.

* * * * *